United States Patent
Gilbert et al.

(10) Patent No.: US 7,272,599 B1
(45) Date of Patent: *Sep. 18, 2007

(54) METHOD AND APPARATUS FOR USING WAVELETS TO PRODUCE DATA SUMMARIES

(75) Inventors: Anna C. Gilbert, Summit, NJ (US); Ioannis Kotidis, Morris Plains, NJ (US); Shanmugavelayutham Muthukrishnan, Washington, DC (US); Martin J. Strauss, Summit, NJ (US)

(73) Assignee: AT & T Corp., New York, NY (US)

( * ) Notice: Subject to any disclaimer, the term of this patent is extended or adjusted under 35 U.S.C. 154(b) by 705 days.

This patent is subject to a terminal disclaimer.

(21) Appl. No.: 10/114,136

(22) Filed: Apr. 2, 2002

Related U.S. Application Data

(60) Provisional application No. 60/281,202, filed on Apr. 3, 2001.

(51) Int. Cl.
*G06F 17/30* (2006.01)
*G06F 17/00* (2006.01)

(52) U.S. Cl. .................. 707/4; 707/5; 707/6; 707/102; 707/104

(58) Field of Classification Search ................ 707/200, 707/4, 3, 5, 6, 102, 104
See application file for complete search history.

(56) References Cited

U.S. PATENT DOCUMENTS

| | | | |
|---|---|---|---|
| 6,718,346 B1* | 4/2004 | Brown et al. ............... 707/200 |
| 6,760,724 B1* | 7/2004 | Chakrabarti et al. ........... 707/4 |
| 6,871,165 B2* | 3/2005 | Aggarwal ................... 702/189 |
| 6,882,997 B1* | 4/2005 | Zhang et al. .................. 707/6 |
| 2003/0204499 A1* | 10/2003 | Shahabi et al. ................ 707/3 |
| 2006/0007858 A1* | 1/2006 | Fingerhut et al. ........... 370/229 |

OTHER PUBLICATIONS

"Self-tuning Histograms: Building Histograms Without Looking at Data," by A. Aboulnaga et al, *Proceedings of the ACM SIGMOD Conference*, 1999, pp. 181-192.

"Tracking Join and Self-join Sizes in Limited Storage," by N. Alon et al, *ACM Symposium on Principles of Database Systems* (PODS), 1999, pp. 10-20.

(Continued)

*Primary Examiner*—Don Wong
*Assistant Examiner*—Thanh-Ha Dang

(57) ABSTRACT

A system and method are provided for summarizing dynamic data from distributed sources through the use of wavelets. The method comprises receiving a first data signal at a first location, where the first data signal is dynamic, determining a first array sketch of the first data signal and constructing a first wavelet representation by manipulating the first array sketch with a B-term wavelet expansion to produce a first representation. The method further comprises receiving a second data signal at a second location, where the second data signal is dynamic and where the second location is distinct from the first location, determining a second array sketch of the second data signal, and constructing a second wavelet representation by manipulating the second array sketch with a B-term wavelet expansion to produce a second representation. In one embodiment, the method further comprises obtaining first and second array sketches from first and second locations respectively, and constructing a wavelet representation of a linear combination of the first and second array sketches. In one embodiment, the expansion is done using a Haar wavelet.

16 Claims, 5 Drawing Sheets

OTHER PUBLICATIONS

"The Space Complexity of Approximating the Frequency Moments," by N. Alon et al, *ACM Symp. on Theory of Computing (STOC)*, 1996, pp. 20-29.

"Evaluating Top-k Selection Queries," by S. Chaudhuri et al, *Proceedings of VLDB Conference*, 1999, pp. 399-410.

"An Introduction to Wavelets," by C. K. Chui, Wavelet Analysis and its Applications, vol. 1, Academic Press, 1992.

"Hancock: A Language for Extracting Signatures from Data Streams," by Corinna Cortes et al, *Proceedings of the Sixth International Conference on Knowledge Discovery and Data Mining*, 2000, pp. 9-17.

"Mining High-Speed Data Streams," by Pedro Domingos et al, *Proceedings of the Sixth International Conference on Knowledge Discovery and Data Mining*, 2000, pp. 71-80.

"Ideal Spatial Adaptation by Wavelet Shrinkage," by David L. Donoho et al, *Biometrika*, 1994, pp. 425-455.

"Computing Iceberg Queries Efficiently," by Min Fang et al, *Proceedings of VLDB Conference*, 1998, pp. 299-310.

"Multi-dimensional Selectivity Estimation Using Compressed Histogram Information," by Ju-Hong Lee, *Proceedings of the ACM SIGMOD Conference*, 1999, pp. 205-214.

"An Approximate L sup 1 -Difference Algorithm for Massive Data Streams," by J. Feigenbaum et al, *Proceedings of IEEE Symposium on Foundations of Computer Science*, 1999, pp. 501-511.

"Testing and Spot-Checking of Data Streams," by J. Feigenbaum et al, SODA, 2000, pp. 165-174.

"Mining Very Large Databases," by V. Ganti et al, *IEEE Computer* 32(8), 1999, pp. 38-45.

"Space-Efficient Online Computation of Quantile Summaries," by M. Greenwald et al, *Proceedings of the ACM SIGMOD Conference*, 2001, pp. 58-66.

"Synopsis Data Structures for Massive Data Sets," by P. Gibbons et al, *SODA*, 1999, pp. 5909-5910.

"New Sampling-Based Summary Statistics for Improving Approximate Query Answers," by P. B. Gibbons et al, *Proceedings of the ACM SIGMOD Conference*, 1998, pp. 331-342.

"Fast Incremental Maintenance of Approximate Histograms," by P. B. Gibbons et al, *Proceedings of VLDB*, 1997, pp. 466-475.

"Clustering Data Streams," by S. Guha et al, Proceedings of the Annual Symposium on Foundations of Computer Science, IEEE, 2000, pp. 359-366.

"Stable Distributions, Pseudorandom Generators, Embedding and Data Stream Computation," by Piotr Indyk, $41^{st}$ *Symposium on Foundations of Computer Science*, 2000, pp. 189-197.

Computing on Data Streams, by Monika R. Henzinger et al, *DIMACS Series in Discrete Mathematics and Theoretical Computer Science*, vol. 50, 1999, pp. 107-118.

"Random Sampling Techniques for Space Efficient Online Computation of Order Statistics of Large Datasets," by G. Manku et al, *Proceedings of ACM SIGMOD Conference*, 1999, pp. 251-262.

"Histogram-Based Estimation Techniques in Database Systems," by V. Poosala, Ph. D. dissertation, University of Wisconsin-Madison, 1997, pp i-xvii and pp. 1-238.

"Approximate Query Processing Using Wavelets," by K. Chakrabarti et al, *Proceedings of VLDB*, 2000, pp. 111-122.

"Wavelet-Based Histograms for Selectivity Estimation," by Y. Matias, *Proceedings of the ACM SIGMOD Conference*, 1998, pp. 448-459.

"Dynamic Maintenance of Wavelet-Based Histograms," by Y. Matias, *Proceedings of the $26^{th}$ VLDB Conference*, 2000, pp. 101-110.

"On Computing Correlated Aggregates Over Contunual Data Streams," by J Gehrke et al, *Proceedings of the ACM SIGMOD Conference*, 2001, pp. 13-24.

"Approximate Computation of Multidimensional Aggregates of Sparse Data Using Wavelets," by J. Vitter et al, *Proceedings of ACM SIGMOD Conference*, 1999, pp. 193-204.

"Data Cube Approximation and Histograms via Wavelets," *CIKM*, 1998, pp. 96-104.

"Stanford Stream Data Manager," http://www-db.stanford.edu/stream/, 5 pages, Jul. 16, 2002.

"Essential Wavelets for Statistical Applications and Data Analysis," by R. T. Ogden, Birhauser, 1997.

"The Theory of Error-Correcting Codes," by F. J. MacWilliams and N. J. A. Sloane, North Holland Mathematical Library, vol. 16, North Holland, New York, 1977.

* cited by examiner

Stream of transactions:

Aggregated stream yields data signal:

$A[0] = 3$, $A[1] = 1$, $A[2] = -1$, $A[3] = 0$, $A[4] = 2$

Data signal with robust histogram overlay

METHOD AND APPARATUS FOR USING WAVELETS TO PRODUCE DATA SUMMARIES

CROSS-REFERENCES TO RELATED APPLICATIONS

This application claims priority to Provisional Application Ser. No. 60/281,202 filed Apr. 3, 2001 entitled Surfing Wavelets on Streams: One-Pass Summaries for Approximate Aggregate Queries.

FIELD OF THE INVENTION

This invention relates generally to the use of wavelets to provide data synopses. More particularly, this invention relates to generating wavelets from dynamic and distributed data sources to summarize data in a small amount of time and space.

BACKGROUND OF THE INVENTION

In various industries, it is increasingly important to obtain representative data, summarize data and/or to determine data trends. This often must be done given the constraints of the existing physical structure of the particular system that generates or receives the data of interest. In addition, this often must be done in a relatively fast amount of time and without burdening the system with respect to memory, processing power, or the like. For example, in the telecommunications industry, it might be of interest to obtain data on call traffic through an area of the network to observe load. However, in doing so, it is important not to usurp the network of its memory and processing abilities for routing call traffic.

There are several tools that can be used to obtain the desired data output. For example, histograms are succinct and space-efficient approximations of distributions of numerical values. Histograms are among the simplest class of data representations. They are easy to visualize and implement statistical analyses. Histograms find many applications in computer systems. For example, most commercial database engines keep a histogram of the various value distributions in a database for optimizing query executions and for approximately processing queries, image processing systems handle color histograms, etc.

In addition to histograms, wavelets can also be used to obtain a desired data synopsis. Wavelets are mathematical functions that divide data into different frequencies and enable the study or manipulation of each frequency component with a particular resolution. Wavelets are used in a variety of applications including image compression, turbulence, human vision, radar, and earth quake prediction.

Histogram and wavelet approximations are compact, i.e., they do not consume a significant amount of memory or processing energy. Although the data representations provided by histograms and wavelets are not exact representations, the data representation is sufficient for most trend analysis.

The present application may be implemented in connection with distributed and dynamic data sources associated with large scale networks. For example, network routers generate a data stream of logs of the traffic that flows through the network. In order to conduct real time traffic control, network operators must know traffic patterns at various routers at any given moment. However, it is prohibitively bandwidth-expensive to transfer data streams of traffic logs from routers to central monitoring stations on a continuous basis. Compact data representations are less bandwidth-expensive.

Space-efficient data representations are also needed in other areas such as the financial industry. Stock transactions continually occur throughout the day and each transaction changes the underlying data distribution. In other words, the volume of shares sold per stock can fluctuate every minute. These transactions are stored in databases in a variety of locations. There is a need to maintain data representations in real time in transactional databases given these rapid data changes.

Prior histogram work has not been able to handle both the positive and negative data updates to perform certain types of distributed data calculations.

Given the foregoing, there is a need in the industry to provide real-time data from distributed databases in a manner that consumes a feasible amount of bandwidth, memory, and processing power, in an accurate and timely manner. This need is especially great where for dynamic data distributions, i.e., where the data changes rapidly.

BRIEF SUMMARY OF THE INVENTION

Limitations of the prior art are overcome and a technical advance is made in accordance with the present invention, illustrative embodiments of which are described below.

In accordance with aspects of one illustrative embodiment of the present invention, a method is provided for outputting a representation, R, corresponding to a data signal A of length N. The method comprises receiving the data signal, determining an array sketch of the data signal, and calculating from the array sketch a B-term wavelet expansion to produce the representation. The number of wavelets B is significantly less than the length of the signal, N. The method further comprises identifying large wavelet coefficients in the representation, estimating the identified large coefficients, determining a residual representation, and iterating the identification and estimation steps with the residual representation. In one embodiment, the expansion is done using a Haar wavelet.

In accordance with other illustrative aspects of the present invention, a method is provided for summarizing dynamic data from distributed sources through the use of wavelets. The method comprises receiving a first data signal at a first location, where the first data signal is dynamic and determining a first array sketch of the first data signal. The method further comprises receiving a second data signal at a second location, where the second data signal is dynamic and where the second location is distinct from the first location and determining a second array sketch of the second data signal. The method further comprises outputting the first and second array sketches to a third location where a B-term wavelet representation for a linear combination of the two data signals is generated.

In one embodiment, the method further comprises obtaining first and second array sketches from first and second locations respectively, and constructing a wavelet representation of a linear combination of the first and second array sketches.

BRIEF DESCRIPTION OF THE DRAWING

The present invention will be more fully understood by reading the following detailed description in conjunction with the drawing, in which.

DETAILED DESCRIPTION OF THE INVENTION

In general, the present invention includes both a data (array) sketching method and a reconstruction method. The array sketch of a data signal can be produced at a router, or other suitable device receiving raw data, or by multiple devices simultaneously. The reconstruction of the array sketch includes the use of wavelets or histograms to achieve representations of the sketches. The reconstruction can take place at a router, a device receiving raw data and creating the array sketch, a data warehouse or other location where data summaries are of interest.

For illustrative purposes, the data used herein to discuss the present invention is information about the traffic, e.g., source and destination addresses, routed through a network such as the Internet. Traffic originates at addresses, such as IP addresses, and travels in packets to routers through a network to respective destination addresses. The data is dynamic in that new traffic is constantly generated and new packets are constantly being sent (or not being sent where they once were). In addition, there are routers distributed throughout the network. In order to obtain a statistical summary of the data, the method of the present invention accommodates the dynamic and distributed nature of the data. It will be appreciated that the present invention is applicable to other data environments where data summaries are desired.

Figure 1:
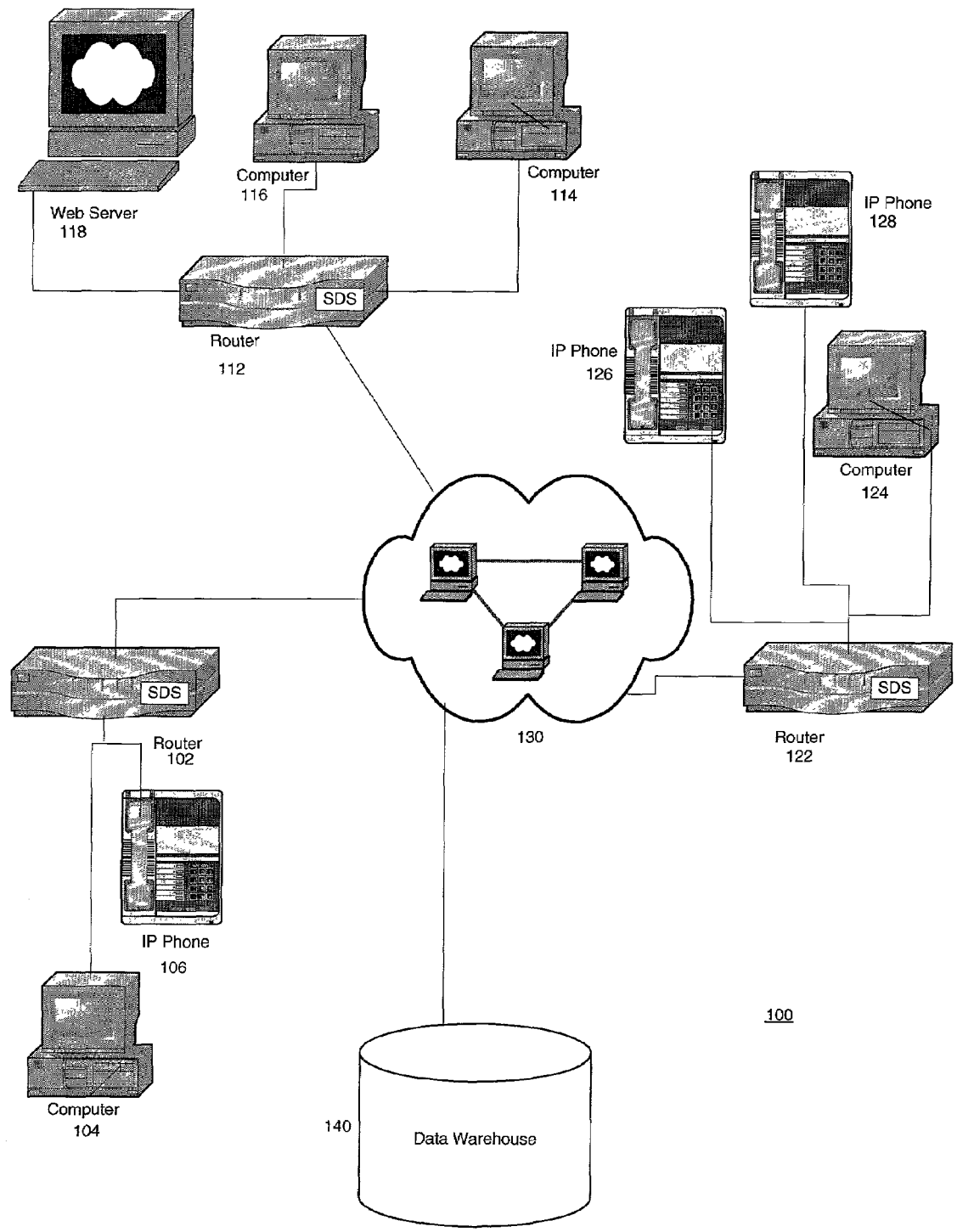
FIG. 1 is a diagram illustrating a network in which the present invention may be illustrated.

FIG. 1 is a diagram of a system illustrating an embodiment in which the present inventive method may be implemented. Network 100 includes routers 102, 112, and 122 as exemplary routers. Routers 102, 112, and 122 route data packets through network 130. Connected to each of routers 102, 112, and 122 are various devices that represent potential origination (and destination) addresses from which raw data will originate and be transmitted through the appropriate router and then through Internet 130. These devices include web server 118, computers 104, 114, 116, and 124, and IP telephones 106, 126, and 128. It will be obvious to one of ordinary skill in the art that many other devices, now known or later discovered, whether individually connected or over a LAN, can also be suitable devices to transmit data through a network, via a wired or wireless connection.

Within each router 102, 112, and 122, is shown a synopsis data structure (SDS). In accordance with one embodiment of the present invention, each SDS receives and stores raw data and builds array sketches from the data, discussed below, for subsequent histogram or wavelet reconstruction, either within the router or by some other device at that or another location. By building the sketches at the routers, the distribution cost of transmitting raw data is saved.

More specifically, the SDS is defined to be of a small space and to support all necessary computations in a small time. In this case, small means a value of at most polynomial in B, log N, and $1/\epsilon$. The term B is the number of buckets for a histogram or, for wavelets, the number of wavelet terms in the representation. The term N is the length of the data array. The term $\epsilon$ is a low-value, user-defined parameter. For histograms, the SDS updates the arrays as new data is received, identifies dyadic intervals with large projections, estimates the best parameters to store in each interval, and estimates norms. A dyadic interval is of the form $[i2^j, \ldots, (i+1)2^j)$, for integers i and j, as is known in the art.

An aspect of the present invention uses the SDS by repeatedly adding to a partial histogram, the dyadic interval that reduces the error of approximation the most. This repetition is continued until a stable representation of the data signal is achieved with poly (B, log N, $1/\epsilon$) buckets. Within the present application, this stable representation is referred to as a robust approximation of the signal. The robust approximation reflects the fact that the possible information has been extracted from the original data signal in a B-bucket approximation. The robust approximation, $H_r$, is then used to produce a B-bucket approximation H.

In the wavelet arena, the SDS updates the arrays as new data is received, identifies wavelet coefficients with large absolute value, estimates those large coefficients and estimates norms. The present invention produces a B-term wavelet representation from a given array, that minimizes the representation error.

Data Array Sketches

Within the present application, the following notation is used. A is a vector (or signal) of length N. (In other words, $A=a[0], a[1], a[2], \ldots, a[N-1]$.) For an interval $I \subseteq [0, N)$, $\pi(A, I)$ denotes the projection of the vector A on interval I. In other words, $\pi(A, I)$ equals A on I and zero elsewhere. The vector $\chi_I$ equals 1 on I and zero elsewhere.

The data about packets traveling through a network can be grouped and thought of as an array of data. An array sketch is a data structure for a dynamic array A that supports generalized updates to A and several fundamental queries about A. The data structure is parameterized by $\epsilon_s$, $\eta$, and N, where $\epsilon_s$ and $\eta$, are user defined parameters and N is the length of the data array. For array sketches, small is defined as a value of at most polynomial in log (N), $1/\eta$, and $1/\epsilon_s$. "Compact" means a small size and "quickly" means using a small amount of time.

A $(\epsilon_s, \eta, N)$—array sketch of a signal A, is a compact synopsis data structure that represents an array of length N and quickly supports the following operations: update, identification and estimation. The update operation means that given a number c and an interval I, an array sketch can be computed for $A+c\chi_I$. The identification means that a list of all dyadic intervals I can be identified such that $\|A-c^I_{opt}\chi_I\| \leq (1-\eta)\|A\|$ but contains no interval I such that $\|A-c^I_{opt}\chi_I\| > (1-\eta/2)\|A\|$. With regard to the estimation characteristics, the array sketch can estimate both norms and parameters. In estimating norms, $\|A\|_s$ can be obtained such that $\|A\| \leq \|A\|_s \leq (1+\epsilon_s)\|A\|$. In estimating parameters, given an interval I, a value c can be obtained such that $\|A-c\chi_I\| \leq (1+\epsilon_s)\|A-c^I_{opt}\chi_I\|$.

In general, given a data signal A, interval I and number c are determined such that $\|A-c\chi_I\|$ is significantly less than $\|A\|$. The signal A is then updated with $A-c\chi_I$.

Histograms

Histograms are general piecewise-constant approximation of data distributions. For example, suppose A is a function, distribution, signal or the like of N points given by A [0 ... N). A B-bucket histogram H of A is defined by a partition of the domain [0 ... N) into B buckets (intervals) $B_i$, as well as by B parameters $b_i$. For any $x \in [0 ... N)$, the value of H(x) is equal to the $b_i$ term, such that $x \in B_i$. Since B is typically much smaller than N, this is a lossy representation. The quantity $\|A-H\|_p$, where $\| \|_p$ is the $l_p$ norm, is the error in approximating A by a B-bucket histogram H. Typically, the norms of interest are $l_1$, average absolute value error, or $l_2$, root means square error.

The basic problem is to identify a sufficient histogram for a given data structure and optimize the histogram. In other words, it is desirable to minimize $\|A-H\|_1$ or $\|A-H\|_2$. It is a special case where the data inputs include dynamic data, i.e., data that is constantly changing or updating, and where the data sources are distributed, e.g., throughout a network. Histograms for single static data streams can be determined in a straightforward way as is known in the art, but permits for no data updates. However, histograms of dynamic distributed data streams prove to be a more difficult problem.

A B-bucket histogram H can be obtained given the robust approximation $H_r$. In an exemplary embodiment, dynamic programming can be used to construct optimal histograms. However, this assumes knowledge of the exact or approximate value of the error of a histogram when projected on a subinterval. In a sketch setting, this is not possible because the sketch is constructed for the entire interval. The sketch may suggest subintervals with large projection but cannot evaluate norms projected to subintervals. When this is the case, a technique of creating a set of histograms within a given interval may be used. This permits the addition of "subintervals" and circumvents the necessity of knowing projections.

More specifically, a suitable histogram H of data signal A can be computed as follows.
1. Create a sketch of the data signal.
2. Construct a robust histogram from a sketch.
   a. Identify the resolution levels of dyadic intervals of the representation.
   b. Identify a single dyadic interval that improves the representation, i.e., brings $\hat{H}_r$ closer to a robust histogram.
   c. Add the dyadic interval identified in step b to the intermediate representation, $\hat{H}_r$.
   d. Iterate with subsequent dyadic intervals until the representation is robust, $H_r$.
3. Construct an output histogram, H, from the sketch and the robust histogram via a hybrid histogram H*.

The robust histogram, $H_r$, is defined as a $(B_r, \epsilon_r)$ robust approximation of A with poly (B, log N, 1/$\epsilon$) B-buckets if, given any collection of X, of $|X| \leq B_r$ non-overlapping intervals, any histogram H' which can be expressed as $$H' = \begin{cases} H_r, [0, N) - \bigcup_{I \in X} I \\ c_I \chi_I, I \in X \end{cases}$$

satisfies $(1-\epsilon_r)\|A-H_r\| \leq \|A-H''\|$. In other words, whenever H' refines $H_r$ by at most B intervals, H' does not significantly improve the error. A robust histogram is not improved much if it is refined by a small number of additional buckets. While $|X| \leq B_r$ is small, $\bigcup_{I \in X} I$ can be large, e.g., equal to [0, N).

To achieve a representation, $H_r$, the current representation, H', is improved until taking B more intervals does not improve the error significantly. Finding $H_r$ is similar to finding a wavelet representation, as discussed below.

If H=H' everywhere except on a non-overlapping set of intervals X, then $\|A-H\|-\|A-H''\|=$ $$\sum_{I \in X}$$

$(\|\pi(A-H, I)-\|\pi(A-H', I)\|)$. Where H is not a robust approximation of A, it can be improved by B intervals. The histogram can be improved by repeatedly identifying and subtracting off sets of large coefficients. Given a histogram H that is not robust, there exists a dyadic interval I and a parameter c such that a histogram H', which agrees with H everywhere except I, and takes the value c on I, approximates A better than H by a factor of $1-\epsilon_r/(4B_r \log N)$.

Recall that a dyadic interval is of the form $[i2^j, ..., (i+1)2^j)$, for integers i and j. There are a small number of "resolution levels" which are possible values for integer j, or the length of the interval. Dyadic intervals at a particular resolution level do not overlap. Dyadic intervals can be written as a non-overlapping union of a small number of these resolution levels. Each resolution level can be identified, removed and replaced with an estimate.

When building a robust representation, $H_r$, if the current form of the representation is not robust, denoted $\hat{H}_r$, then some B non-overlapping intervals will improve the error by $1-\epsilon_r$. By definition, some one interval improves the error by $1-\epsilon_r/2B$. That implies that some single dyadic interval improves the error by $1-\epsilon_r/4B \log N$. So, if the representation is not already robust, a single dyadic interval can be determined that improves the representation significantly. Once that interval is removed, the process is repeated with subsequent dyadic intervals until the representation is robust, $H_r$.

This robust representation, $H_r$, already has good error. Specifically, $$(1-\epsilon_r)\|A-H_{opt}\| \geq \|A-H_r\|$$

where $H_{opt}$ is an optimal histogram. However, $H_r$ has too many buckets from the iterative process. The next step is to obtain a desired (lesser) number of buckets given the sketch and the robust histogram, to build an output histogram, H.

To reduce the number of buckets, consider joining, whole or fractal, adjacent buckets. As buckets are being joined, the error must be monitored against a threshold error. By doing so, the error will either stay the same, or more likely, increase, if using only whole buckets. The error may stay the same, increase or decrease if fractal buckets are also combined. If the error decreases, the definition of robust is contradicted. More specially, $H_r$ is robust; and by definition, robustness means that it is immune to splitting buckets, i.e., it is immune to making available partial buckets. Thus, in order to combine whole buckets, the buckets must first be divided into multiple distinct buckets. Once divided, the error will not decrease significantly.

Next it is necessary to determine where to place the first bucket boundary. There are N places where the boundary could be placed. In order to minimize the time in finding the appropriate boundary, a binary search is performed. It is important that the error increases as the bucket increases so that an accurate search can be performed. For example, a first bucket boundary is placed half way along $H_r$. The error is calculated and compared to an optimal error. If the error is too large, the boundary is moved to reduce the size of the bucket, e.g., to one-quarter of $H_r$. If the error is not too large, that bucket can be used, or the boundary can be moved to increase the size of the bucket, e.g., to three-quarters of $H_r$. This process is repeated until a suitable boundary is determined.

Determining an optimal error for the first bucket is a standard technique known as dynamic programming, as one skilled in the art will appreciate. The optimal error, $\delta$, is equal to $\|A-H_{opt}\|$. Assume that $\delta$ is known approximately, e.g., up to a factor of $1\pm\epsilon$. The optimal error, $\delta$, can be determined by "guessing" at multiples of the factor $1\pm\epsilon$. In other words, try $\delta=1$; $\delta=1+\epsilon$; $\delta=(1+\epsilon)^2$; etc. The objective is to obtain H whose error is at most $(1+\epsilon)$ $\delta$, i.e., $\|A-H\| \leq (1+\epsilon)\delta$. To do this, find a histogram on the interval $[0, i)$ with k buckets and an error $\leq 1$. Compute this histogram for $i=1, \ldots, N$; for $k=1, \ldots, B$ (all buckets); and for all possible multiples of the error from 1 to $\delta$ in increments of $\epsilon\delta$, where there is some upper bound on $\delta$.

In reality, the error of a bucket cannot be determined. The bucket can be thought of as an interval $A_I$, which is equal to A on the interval $[0, i)$ and 0 on the interval $[i, N)$. The error is $\|A_I-H_I\|$, however the error on an interval cannot be directly calculated. In contrast, the error of the whole signal A, of an $l_1$ norm, can be calculated directly.

A hybrid, H*, is constructed where H* is H on the interval I and $H_r$ elsewhere. With the hybrid, the error $\|H^*-A\|$ can be estimated. The hybrid is constructed one bucket at a time, e.g., on an increasing prefix i, from 0 to N. When i has increased to N, H* is equal to the output histogram H and has none of the robust histogram, $H_r$, remaining. Thus a suitable output histogram, H, has been determined.

Figures 2A, 2B:
FIG. 2*a* is a representation of an exemplary stream of data transactions to be summarized by the present invention.
FIG. 2*b* is a representation of the aggregated stream, which yields data signal, A.
Figure 3A:
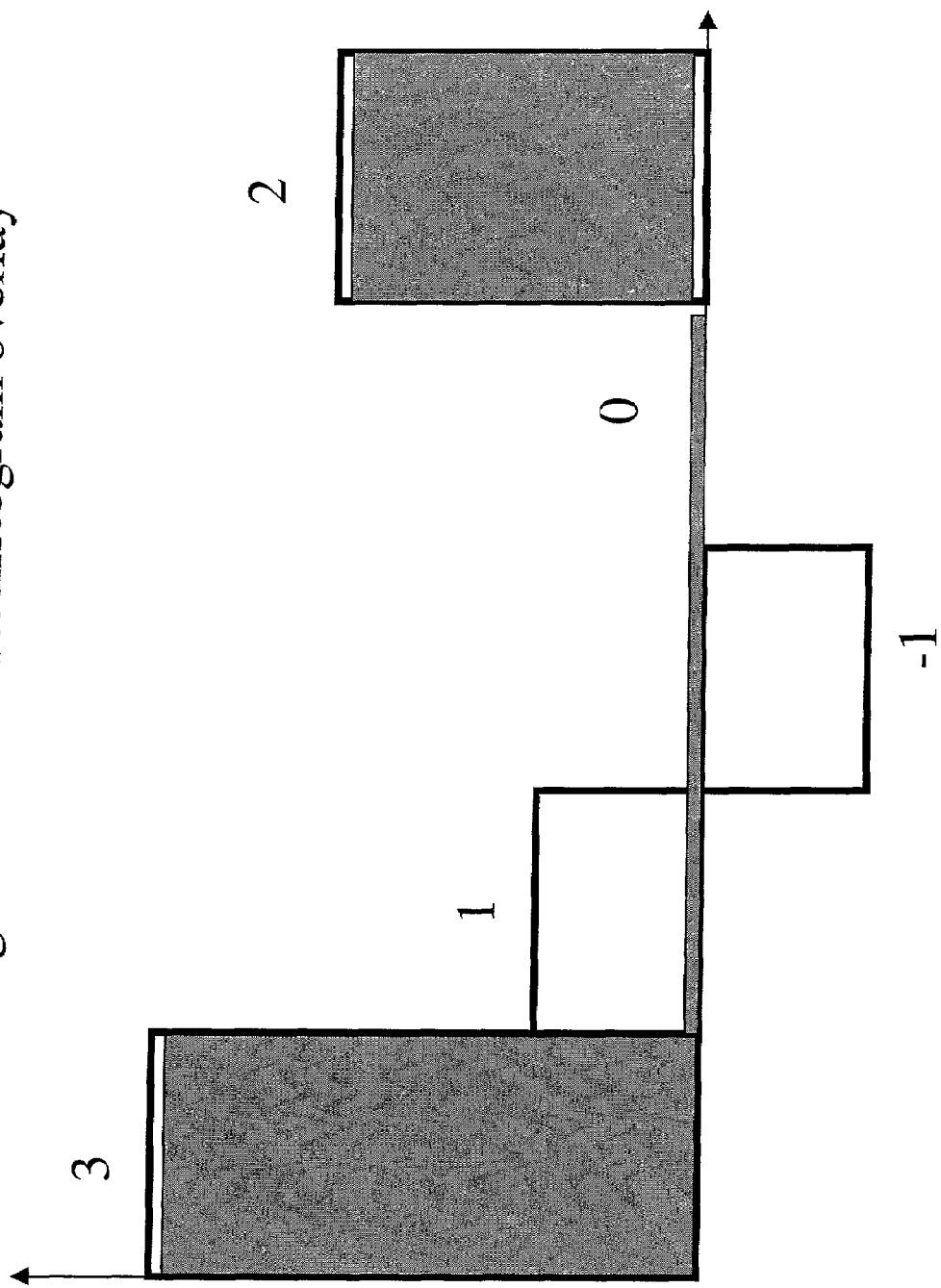
FIG. 3*a* is a graphical representation of the data signal A of FIG. 2*b* with a robust histogram overlay.
Figure 3B:
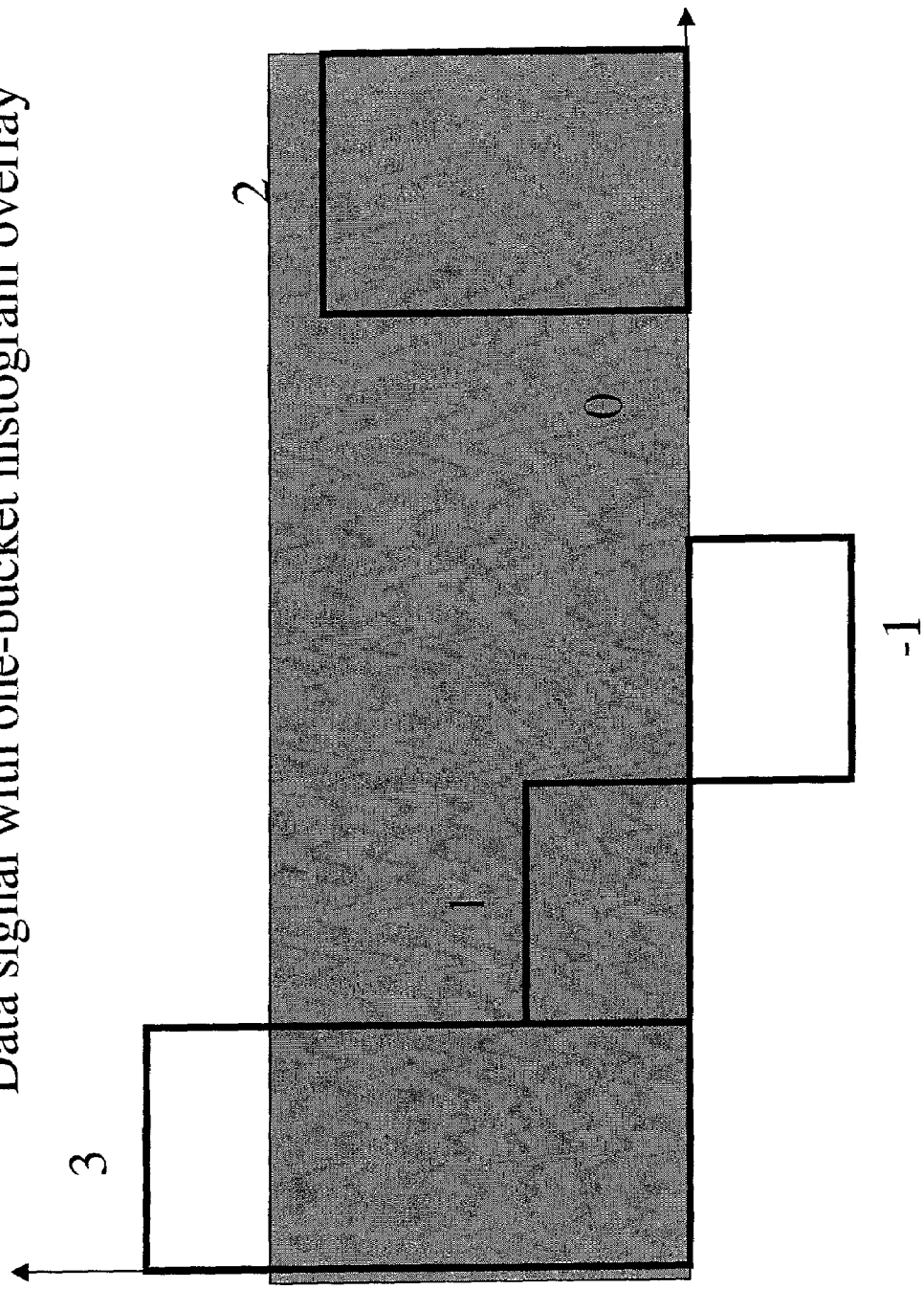
FIG. 3*b* is a graphical representation of data signal A with a one-bucket output histogram overlay.

The following figures depict the above text in graphical form. FIG. 2a is a representation of an exemplary stream of data transactions to be summarized by the present invention. FIG. 2b is a representation of the aggregated stream, which yields data signal, A. FIG. 3a is a graphical representation of the data signal A of FIG. 2b with a robust histogram overlay. FIG. 3b is a graphical representation of data signal A with a one-bucket output histogram overlay.

Wavelets

In addition to histograms, wavelets can also be used to summarize data signals. As noted above, wavelets are mathematical functions that divide data into different frequencies to facilitate summarizing and analyzing data.

In one embodiment, to produce a desired data summary of traffic traveling through a router, a Haar wavelet is used to represent the data. A Haar wavelet, $\psi_{j,k}$, on $[0, N)$ has the following characteristics:

$$\psi_{j,k} = \begin{cases} +2^{j/2}, & \left[2^{-j}k, 2^{-j}\left(k+\frac{1}{2}\right)\right] \\ -2^{j/2}, & \left[2^{-j}\left(k+\frac{1}{2}\right), 2^{-j}(k+1)\right] \\ 0, & \text{elsewhere} \end{cases}$$

Given the above data signal $A=a[0], a[1], a[2], \ldots, a[N-1]$, a B-term Haar wavelet expansion is used to approximate A by a representation R as follows:

$$R = \sum_{\lambda \in \Lambda} d_\lambda \psi_\lambda$$

where $d_\lambda$ coefficients are the inner products of A and $\psi_\lambda$ and the index of set $\Lambda$ is of size B. $R_{opt}$ is defined as an optimal B-term representation. Given the data signal A and the B Haar wavelets, the present invention will return R, a B-term wavelet representation for A, with the following properties with regard to error, processing time and working space.

1. The error is small. The error $\|A-R\|_2$ will be less than or equal to $(1+\epsilon)\|A-R_{opt}\|_2$. The term $\epsilon$ is a user-defined error parameter.

2. The processing time is fast. The time to process will be polynomial in B and log $N/\epsilon$.

3. The working space to compute the representation is small. The working space is polynomial in B and log $N/\epsilon$.

In the present network example, these properties are necessary to create the representation at a router that has strict allocation of its properties and not much available processing time and working space. In addition, if the representation has a significant error from the original signal, the representation is not of much value.

Figure 4:
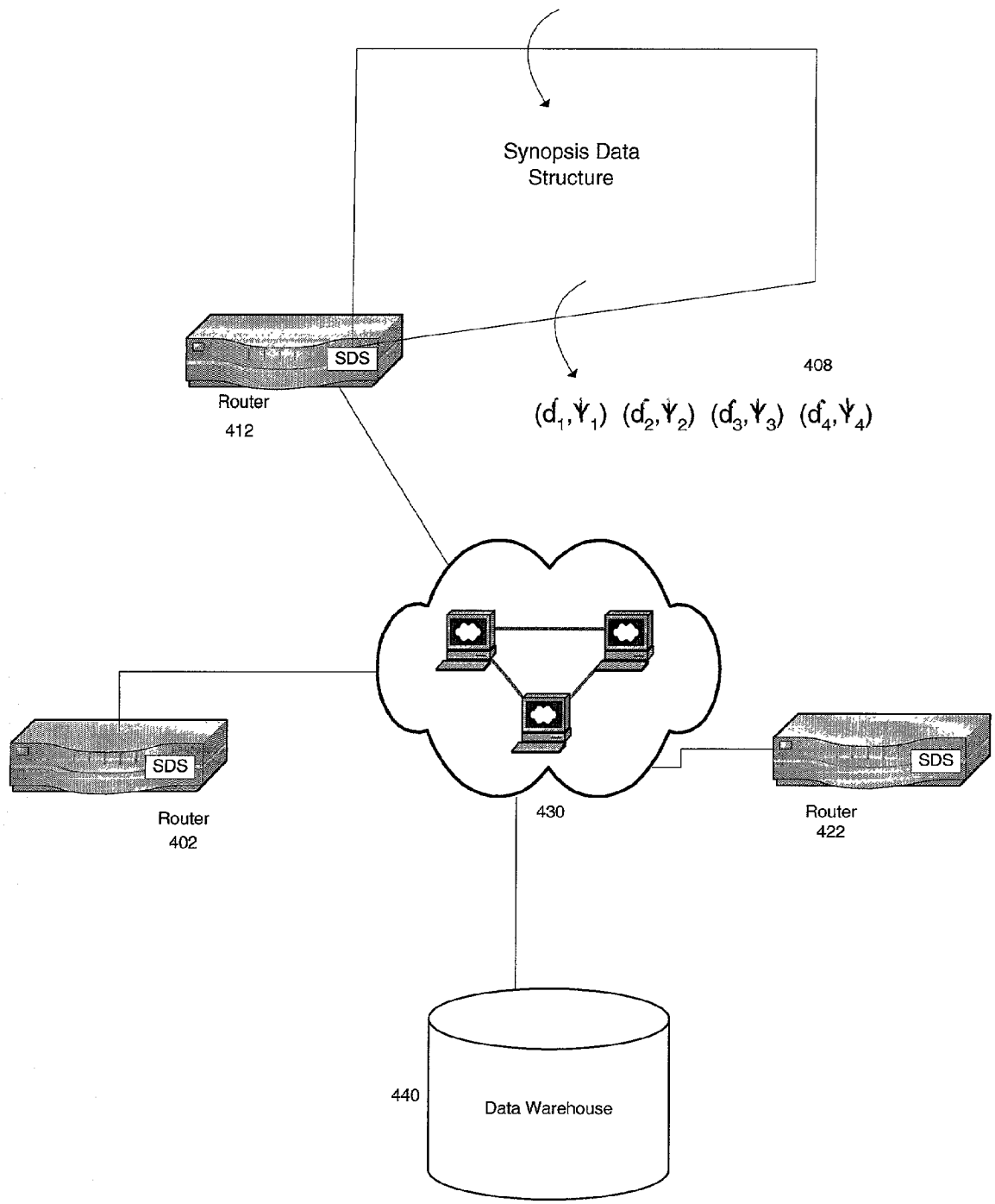
FIG. 4 is a portion of the network of FIG. 1 showing the operation of a synopsis data structure for generating wavelets in accordance with an exemplary embodiment of the present invention.

FIG. 4 is a portion of the network of FIG. 1 showing the operation of the synopsis data structure. While router 412 is being used for exemplary purposes, it will be appreciated that routers 402 and 422 operate in a similar manner. Data signal 401 is received and processed as described herein by the synopsis data structure of router 412. In response to a request for a wavelet representation, wavelet coefficients and the corresponding wavelet 408 are output from the synopsis data structure. Output 408 can then be sent off to data warehouse 440, or some other central collection location, via network 430 for collection and/or further processing.

The data stream is constantly changing. Data warehouse 440 can request wavelet representations or array sketches from any or all of routers 402, 412 and 422 to then compile the dynamic data from the distributed routers.

Given the above tools, a suitable representation R of data signal A can be computed as follows.

1. Using the data array sketches, identify the relatively large wavelet coefficients in a representation, using a non-adaptive group testing method as is known in the art.

2. Estimate the identified large coefficients. Add to Representation R these significant wavelet terms, weighted by their coefficients. The estimation can be done using the data array sketches.

3. Iterate steps 1 and 2 with the residual representation.

The above method can be illustrated with the following example, where a three term data signal is given and a two-term representation is desired.

$$A = 4\psi_1 + 10\psi_2 + 5\psi_3.$$

Iteration No. 1:
   Step 1: Identification. The second coefficient, 10, is big.
   Step 2: Estimation. Ten (10) is estimated as 11.
   Step 3: Residual. Subtract R from A. R=11 $\psi_2$. Residual (error)=4 $\psi_1$−1 $\psi_2$+5 $\psi_3$.

Iteration No. 2:
   Step 1: Identification. The first coefficient, 4, is big.
   Step 2: Estimation. Four (4) is estimated as 3.5.
   Step 3: Residual. R=3.5 $\psi_1$+11 $\psi_2$. Residual (error)=0.5 $\psi_1$−1 $\psi_2$+5 $\psi_3$.

And so forth.

With the wavelet representations, the large coefficients are identified and removed from the representation. Wavelet basis functions are orthogonal, so when one coefficient is removed, the other coefficients remain unaffected.

The present invention is described above, often with reference to routers and network data. It will be understood, however, this is exemplary. The present invention may be useful in many other contexts as would be obvious to one of ordinary skill. For example, the present invention may be implemented when it is desirable to analyze a vector sum without revealing the individual vectors that form the basis of the sum. There is known cryptographic literature for performing a vector sum protocol privately. This literature describes a technique where intermediate messages look random and give no indication of the vectors being added. To implement this technique, you need to start with a full circuit for computing the function. In other words, there is a circuit, known in the art for computing the vector sum, and cryptographic literature teaches that this circuit can be kept private by making intermediate messages needed to compute the sum, look random. This technique is costly in that N communications are required for an input vector of length N.

With the present invention, vector sums can be calculated, while maintaining the confidentiality of the underlying vectors that compose the vector sum, in an amount of time that is a logarithmic factor of the N communications. To implement the present invention, where multiple parties desire to combine their data while maintaining the confidentiality of their individual data from the other parties, each party makes an array sketch of his data. The sketches are small, in comparison to the original data. The sketches are added to yield a vector sum, which is small in comparison to the above known technique, because the inputs are smaller. Because the sketches are linear functions of the original vectors, the sketch of the vector sum is the sum of the sketches. Thus, whatever is computed from the sketch of the vector sum depends only on the vector sum. In other words, the vector sum does not depend on the initial input sketches individually, only the sum of the sketches. Confidentiality of the initial data can thus be maintained.

Although embodiments of the present invention are illustrated in the accompanying Figures and are described in this Detailed Description, it is understood that the present invention is not limited to these embodiments, but is capable of numerous arrangements, modifications, and substitutions without departing from the spirit or scope of the invention as defined in the claims. Various modifications and adaptations of the present invention will be apparent to persons skilled in the art.

What is claimed is:

1. A method for providing a representation, R, corresponding to a data array A of length N, comprising:
   receiving the data array;
   determining an array sketch of the data array;
   expanding the array sketch with a B-term wavelet expansion to produce a representation;
   identifying large wavelet coefficients in the representation;
   estimating the identified large coefficients;
   determining a residual representation;
   iterating the identifying and estimating steps with the residual representation until the large coefficients are removed;
   wherein the representation is of a form $$R = \sum_{\lambda = \Lambda} d_\lambda \psi_\lambda$$

where $d_\lambda$ is equal to $<a, \psi_\lambda>$, a are data signal coefficients, $\psi_\lambda$ are wavelets, and $\Lambda$ is an index set is of size B; and
   observing traffic in a network using the resulting representation R.

2. The method of claim 1, wherein the B-term wavelet expansion uses a Haar wavelet.

3. The method of claim 2, where the determining of the array sketch step occurs at a router in a network and the expanding step occurs at a data warehouse.

4. The method of claim 1, where the determining the array sketch step and the expanding step occur at different locations.

5. The method of claim 1, where all the steps are performed at a network router.

6. The method of claim 1, wherein the array sketch is a compact synopsis data structure.

7. The method of claim 1, wherein the data array is dynamic.

8. A method for providing a representation, R, corresponding to a data array A of length N, comprising:
   receiving the data array;
   determining an array sketch of the data array;
   expanding the array sketch with a B-term wavelet expansion to produce a representation;
   identifying large wavelet coefficients in the representation;
   estimating the identified large coefficients;
   determining a residual representation;
   iterating the identifying and estimating steps with the residual representation until the large coefficients are removed;
   wherein the representation has the following properties:
      error is at most $\|A-R\|_2$ and less than or equal to $(1+\epsilon)\|A-R_{opt}\|_2$,
      where $R_{opt}$ is an optimum representation, and term $\epsilon$ is a user-defined parameter,
      processing time is polynomial in B and log N/$\epsilon$, and working space is polynomial in B and log N/$\epsilon$; and
   observing traffic in a network using the resulting representation R.

9. A method for providing a summary of multiple data arrays, comprising:
   receiving a first data array at a first location, where the first data array is dynamic;
   determining a first array sketch of the first data array;
   constructing a first wavelet representation by manipulating the first array sketch with a B-term wavelet expansion to produce a first representation;
   receiving a second data array at a second location, where the second data array is dynamic and where the second location is distinct from the first location;
   determining a second array sketch of the second data array;
   constructing a second wavelet representation by manipulating the second array sketch with a B-term wavelet expansion to produce a second representation;
   outputting the first and second representations to a third location;
   wherein in providing the summary, for each wavelet representation,
      error is at most $\|A-R\|_2$ and less than or equal to $(1+\epsilon)\|A-R_{opt}\|_2$,
      where $R_{opt}$ is an optimum representation, and term $\epsilon$ is a user-defined parameter,
      processing time is polynomial in B and log N/$\epsilon$, and working space is polynomial in B and log N/$\epsilon$; and
   observing traffic in a network using the resulting summary.

10. The method of claim 9, where the constructing a first wavelet representation step and the constructing a second wavelet representation step occur at the third location.

11. The method of claim 9, where the constructing a first wavelet representation step and the constructing a second wavelet representation step occur at the first location and second locations respectively.

12. The method of claim 11, where the first and second data arrays are call detail data, the first and second locations are first and second routers respectively, and the third location is a data warehouse.

13. The method of claim 12, where the first array sketch and second array sketch are stored in respective synopsis data structures of the first and second routers.

14. An apparatus for providing a summary of a data array A of length N, comprising:

means for receiving the data array;
means for determining an array sketch of the data array;
means for expanding the array sketch with a B-term wavelet expansion to produce a representation;
means for identifying large wavelet coefficients in the representation;
means for estimating the identified large coefficients;
means for determining a residual representation;
means for iterating the identifying and estimating steps with the residual representation until the large coefficients are removed;
wherein the representation is of a form $$R = \sum_{\lambda \in \Lambda} d_\lambda \psi_\lambda$$

where $d_\lambda$ is equal to $<a, \psi_\lambda>$, a are data signal coefficients, $\psi_\lambda$ are wavelets, and $\kappa$ is an index set is of size B; and
means for observing traffic in a network using the resulting summary.

15. The apparatus of claim 14, wherein the data array is dynamic in that the data array may change in a positive or negative manner.

16. A method for providing summaries of multiple call detail data, comprising:

receiving first call detail data at a first router, where the first call detail data is dynamic;
determining a first array sketch of the first call detail data;
constructing a first wavelet representation by manipulating the first array sketch with a B-term wavelet expansion to produce a first representation;
receiving second call detail data at a second router, where the second call detail data is dynamic and where the second router is distinct from the first router;
determining a second array sketch of the second call detail data;
constructing a second wavelet representation by manipulating the second array sketch with a B-term wavelet expansion to produce a second representation;
outputting the first and second representations to a data warehouse;
wherein in providing the summary, for each wavelet representation,
error is at most $\|A-R\|_2$ and less than or equal to $(1+\epsilon)\|A-R_{opt}\|_2$,
where A is the respective call detail data of length N, R is the respective wavelet representation, $R_{opt}$ is an optimum representation, and term $\epsilon$ is a user-defined parameter,
processing time is polynomial in B and log N/$\epsilon$, and
working space is polynomial in B and log N/$\epsilon$; and
observing traffic in a network using the resulting summaries.

\* \* \* \* \*